(12) United States Patent
Jagt et al.

(10) Patent No.: US 8,399,898 B2
(45) Date of Patent: Mar. 19, 2013

(54) POLARIZED LIGHT EMITTING DEVICE

(75) Inventors: Hendrik Johannes Boudewijn Jagt, Eindhoven (NL); Celine Catherine Sarah Nicole, Eindhoven (NL)

(73) Assignee: Koninklijke Philips Electronics N.V., Eindhoven (NL)

( * ) Notice: Subject to any disclaimer, the term of this patent is extended or adjusted under 35 U.S.C. 154(b) by 310 days.

(21) Appl. No.: 12/738,312

(22) PCT Filed: Oct. 20, 2008

(86) PCT No.: PCT/IB2008/054294
§ 371 (c)(1),
(2), (4) Date: Apr. 16, 2010

(87) PCT Pub. No.: WO2009/053881
PCT Pub. Date: Apr. 30, 2009

(65) Prior Publication Data
US 2010/0220459 A1 Sep. 2, 2010

(30) Foreign Application Priority Data
Oct. 25, 2007 (EP) ..................... 07119246

(51) Int. Cl.
*H01L 33/10* (2010.01)
*H01L 33/50* (2010.01)
*F21V 9/14* (2006.01)

(52) U.S. Cl. ........... 257/98; 257/E33.067; 257/E33.059; 257/E33.061; 362/19

(58) Field of Classification Search .............. None
See application file for complete search history.

(56) References Cited

U.S. PATENT DOCUMENTS

| 5,952,681 | A | * | 9/1999 | Chen ............................. 257/89 |
| 7,148,514 | B2 | * | 12/2006 | Seo et al. ...................... 257/79 |
| 2002/0093284 | A1 | | 7/2002 | Adachi et al. |
| 2003/0075723 | A1 | * | 4/2003 | Heremans et al. ............ 257/98 |
| 2004/0238810 | A1 | * | 12/2004 | Dwilinski et al. ............. 257/12 |
| 2006/0043400 | A1 | * | 3/2006 | Erchak et al. ................. 257/98 |
| 2006/0065901 | A1 | * | 3/2006 | Aoyagi et al. ................. 257/79 |
| 2006/0066192 | A1 | | 3/2006 | Beeson et al. |

(Continued)

FOREIGN PATENT DOCUMENTS

| EP | 1887634 A2 * | 2/2008 |
| WO | 9836315 A1 | 8/1998 |

(Continued)

OTHER PUBLICATIONS

Narendran, N., Y. Gu, J. P. Freyssinier-Nova, and Y. Zhu. "Extracting Phosphor-scattered Photons to Improve White LED Efficiency." Physica Status Solidi (a) 202.6 (2005): R60-62.*

*Primary Examiner* — Thomas L Dickey
*Assistant Examiner* — Joseph Schoenholtz
(74) *Attorney, Agent, or Firm* — Mark Beloborodov; David Zivan

(57) ABSTRACT

The present invention relates to a light emitting device, comprising: a LED die (10) having a first surface (12), a second surface (14) and at least one side facet (16) connecting the first and the second surface (12, 14). Further, the LED die comprises a light polarizing layer (20), a light blocking layer (30), and a light reflecting layer (40). The light polarizing layer (20) is arranged on the first surface (12), the light blocking layer (30) is arranged on the at least one side facet (16), and the light reflecting layer (40) is arranged on the second surface (14) of the LED die.

10 Claims, 4 Drawing Sheets

U.S. PATENT DOCUMENTS

| | | |
|---|---|---|
| 2006/0091412 A1* | 5/2006 | Wheatley et al. .............. 257/98 |
| 2006/0203468 A1 | 9/2006 | Beeson et al. |
| 2007/0284567 A1 | 12/2007 | Pokrovskiy et al. |
| 2008/0035944 A1* | 2/2008 | Eberhard et al. .............. 257/98 |

FOREIGN PATENT DOCUMENTS

| | | |
|---|---|---|
| WO | 2006035388 A2 | 4/2006 |
| WO | 2007027186 A1 | 3/2007 |

* cited by examiner

POLARIZED LIGHT EMITTING DEVICE

FIELD OF THE INVENTION

The present invention relates to a light emitting device, comprising a LED die having a first surface, a second surface and at least one side facet connecting the first and the second surface. Further, the LED die comprises a light polarizing layer, a light blocking layer, and a light reflecting layer. The present invention also relates to a method for providing polarized light from such LED die.

BACKGROUND OF THE INVENTION

Solid-state light emitting diodes (LEDs) have a prospected bright future for replacing conventional light sources in various lighting applications. More specifically, high-brightness inorganic LEDs are entering markets like automotive lighting, camera flashes, display projection and display backlighting.

The benefits of using these LEDs instead of conventional light sources are given by their small-volume, high luminance and high color saturation.

However, as conventional light sources, LEDs emit non-polarized light, i.e. light that does not posses a significant preference for a specific polarization state. Therefore, in applications requiring polarized light this light must be polarized with other means.

Application areas where polarized light is used are in LCD-backlighting and LCD-projection as well as in options for LC-beam steering devices in which the light beam emitted by LED point sources is manipulated with LC cells.

Also, polarized light yields advantages in both indoor and outdoor illumination as linearly polarized light influences reflections on surfaces which enable the suppression of glare and the subsequent influencing of observation of the illuminated surrounding in visual acuity, observed contrast and color saturation. Because of this influence, polarizing fluorescent luminaries exist as commercial products with a claimed benefit in visual perception.

It is possible to achieve a polarized light emission from the LED by using exotic crystal orientation directions in the fabrication of LEDs. However, such LEDs are difficult to manufacture and it is hard to obtain an efficient light output. Also, the reported polarized contrasts are small.

The common method for polarizing light involves the step of absorbing the unwanted polarization state. This method has an efficiency of about 45%.

US 2006/0066192 A1 discloses an illumination system that incorporates a LED and a reflecting polarizer. The reflecting polarizer transmits a first portion of light emitted from the LED, and reflects a second portion of the light emitted from the LED. The reflected light is incident on the LED, and reflected by the LED. Further, the second portion of light is scattered so that the polarization state of the reflected light is mixed. Thus, parts of the scattered light can be transmitted by the reflecting polarizer so that the total efficiency of the illumination system is increased.

Even if the system disclosed in US 2006/0066192 A1 shows an increased efficiency of polarization, it is not sufficient for many applications.

SUMMARY OF THE INVENTION

It is an object of the present invention to provide an improvement of the above techniques and prior art. More particularly, it is an object of the present invention to provide a polarized LED with increased efficiency.

The above objective is provided according to a first aspect of the invention by a light emitting device, comprising a LED die having a first surface, a second surface and at least one side facet connecting the first and the second surface. The light emitting device further comprises a light polarizing layer, a light blocking layer and a light reflecting layer, wherein the light polarizing layer is arranged on the first surface, the light blocking layer is arranged on the at least one side facet, and the light reflecting layer is arranged on the second surface of the LED die. The light emitting device is advantageous in that it provides polarized light with high efficiency.

The light polarizing layer may cover the complete first surface, the light blocking layer may cover the complete side facet(s), and the light reflecting layer may cover the complete second surface. This is advantageous in that a high polarization contrast is achieved.

The light blocking layer may be a light polarizing layer, which is advantageous in that the blocking layer and the light polarizing layer are manufactured in one piece.

The light blocking layer may be a light reflective layer, which is advantageous in that the blocking layer and the light reflective layer are manufactured in one piece.

The light polarizing layer may be a reflective polarizing layer, which can withstand the high temperature and light flux from the LED die.

The light polarizing layer may be a wire-grid grating. Thus, conventional grating known per se is used.

The light emitting device may further comprise a recycling layer which changes the polarization state of the light, wherein the light recycling layer is arranged between the light polarizing layer and the light reflecting layer. This is advantageous in that a larger amount of polarized light is emitted.

The recycling layer may be a retarding layer or a depolarization layer, which is advantageous in that conventional techniques and materials are used.

A wavelength conversion layer may be arranged between the light polarizing layer and the LED die, which is advantageous in that the efficiency of e.g. green, amber or red light is increased.

The wavelength conversion layer may be a phosphor layer, which is a commonly known material.

According to a second aspect of the invention, a light source is provided comprising at least one light emitting device according to the first aspect of the invention. The advantages of the first aspect of the invention are also applicable for this second aspect of the invention.

The light emitting device may comprise a dome shaped lens covering the die. This is advantageous in that an increased amount of light is extracted from the LED.

The above objective is provided according to a third aspect of the invention by a method for providing polarized light from a LED die having a first surface, a second surface and at least one side facet connecting the first and the second surface. The method comprises the steps of emitting a first amount of light from the first surface of the LED die, emitting a second amount of light from the side facet(s) of the LED die, blocking a first portion of the second amount of light by means of a blocking layer arranged on the side facet(s), blocking a first portion of the first amount of light by means of a polarizing layer arranged on the first surface, transmitting a second portion of the first amount of light through the polarizing layer, converting the polarization state of the first portion of the first amount of light, and transmitting the converted first portion of the first amount of light by means of the polarizing layer. The advantages of the second aspect of the invention are also applicable for this third aspect of the invention.

Other objectives, features and advantages of the present invention will appear from the following detailed disclosure, from the attached dependent claims as well as from the drawings.

BRIEF DESCRIPTION OF THE INVENTION

Embodiments of the present invention will now be described, by way of example, with reference to the accompanying schematic drawings, in which FIG. 1 shows the basic principle of a polarizer according to prior art.

DESCRIPTION OF PREFERRED EMBODIMENTS

Figure 1:
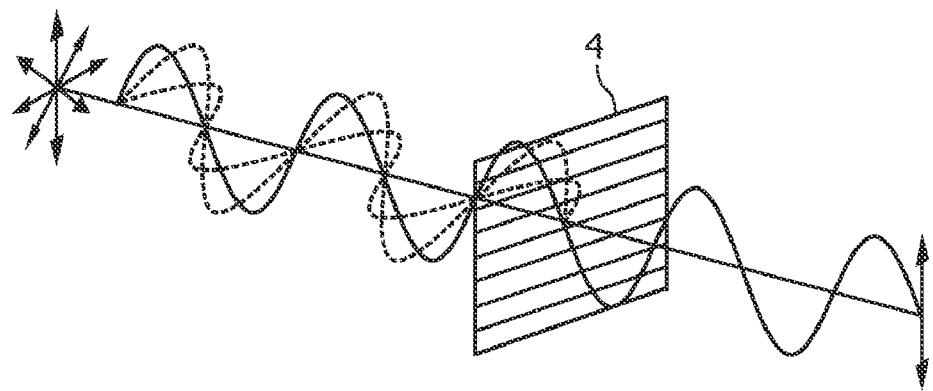

In FIG. 1, the basic principle of a polarizing element is shown. A propagating light wave is illustrated, being incident on a polarizing element 4. The light wave, having no specific state of polarization as indicated by the solid and dashed lines, is transmitted through the polarizing element 4. However, only one part of the light wave having a certain polarization state is transmitted, as illustrated by the solid line. The other parts of the light wave are reflected back, or absorbed by the polarizing element 4.

As shown in FIG. 1, the polarizing element 4 is a grating having a number of slits arranged in parallel. The grating period is less than the wavelength of the light wave. Such polarizing element is commonly known as a wire-grid polarizer. Wire-grid polarizers often consist of small stripes of metal, such as aluminum, separated by air or a dielectric material. The grating period is typically in the order of 100 to 200 nm. A typical duty cycles of metal to gap is 1:1, but other ratios are also applicable, e.g. 1:2. The height of each metal stripe is typically in the order of 100 nm.

Figure 2:
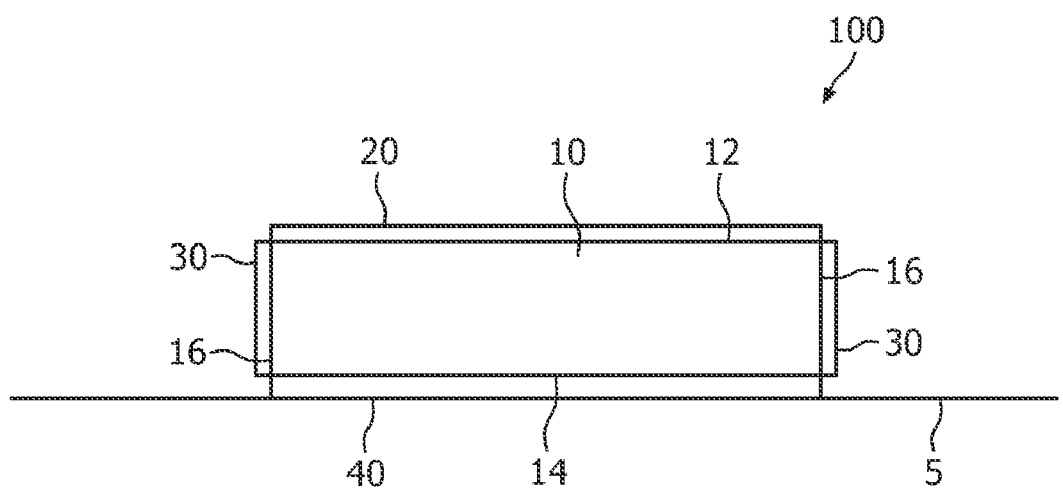
FIG. 2 is a side view of a light emitting device according to a first embodiment of the present invention.

FIG. 2 shows a light emitting device 100 mounted on a substrate 5 of any known kind. The substrate 5 may be a printed circuit board, a socket, etc. The light emitting device 100 has a LED die 10, a light reflective layer 40, a light polarizing layer 20 and a light blocking layer 30. The light polarizing layer 20 is arranged adjacent to a first surface 12 of the LED die 10. The light reflective layer 40 is arranged between the substrate 5 and a second surface 14 of the LED die 10. The light blocking layer 30 is arranged adjacent to the side facets 16 of the LED die 10.

When a voltage is applied over the p/n-junction of the LED die 10, light is emitted towards the first surface 12 and the side facets 16 of the LED die. As with regular LEDs, the emitted light does not have specific polarization angle, but is a mix of several different angles. A first amount of the emitted light is incident on the light polarizing layer 20, and a second amount of the emitted light is incident on the light blocking layer 30. When the first amount of the emitted light hits the light polarizing layer 20, a first portion of the first amount of light is reflected and a second portion of the first amount of light is transmitted. When the second amount of the emitted light hits the light blocking layer 30, at least a first portion is blocked by either reflection or absorption. After reflection, the first portion of the first amount of light is propagating back towards the LED die, and when hitting the light reflective layer 40, the polarization state is affected. Thus, when the first portion of the first amount of emitted light is incident on the light polarization layer 20 for a second time, a part of the light will be transmitted. The reflected light will once again be reflected back to the light reflective layer 40 and slightly change its polarization state, thus leading to an even further transmission at the third, fourth, fifth interaction with the light polarizing layer 20.

The polarizing layer 20 may transmit circularly polarized light and reflect the opposite circular handedness of polarization. For example, the polarizing layer 20 may transmit lefthanded circularly polarized light and reflect right-handed circularly polarized light. Such polarizing layer 20 can be a cholesteric liquid crystal reflective polarizer.

Figure 3:
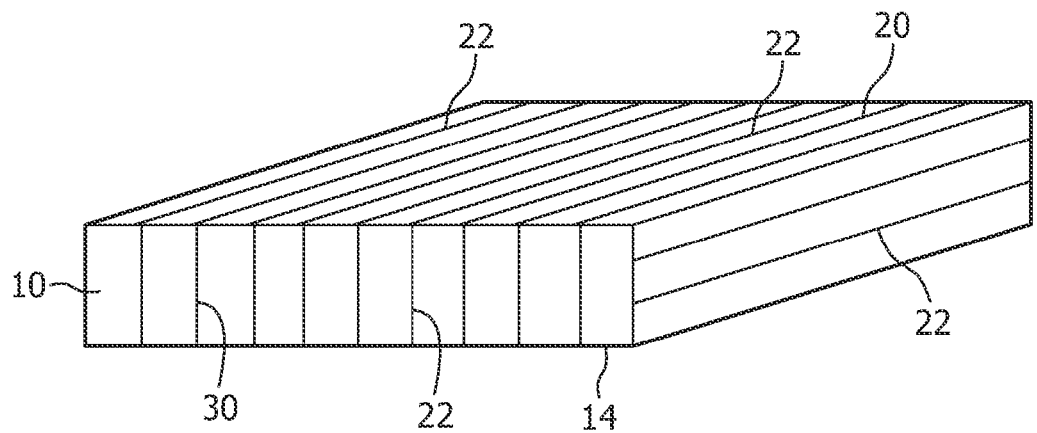
FIG. 3 is a perspective view of a light emitting device according to another embodiment of the present invention.

In FIG. 3, a perspective view of the LED die 10 and the light polarizing layer 20 is shown. In this embodiment the light polarizing layer 20 and the light blocking layer 30 are designed as one single layer. The wire-grid grating 20 and the light blocking layer 30 consists of metal stripes 22 arranged in parallel. The light blocking layer 30 will reflect a first portion of light and transmit a second portion of light. The light blocking layer 30 and the light polarizing layer 20 are covering the entire first surface 12 and the side facets 16 of the LED die 10.

Figure 4:
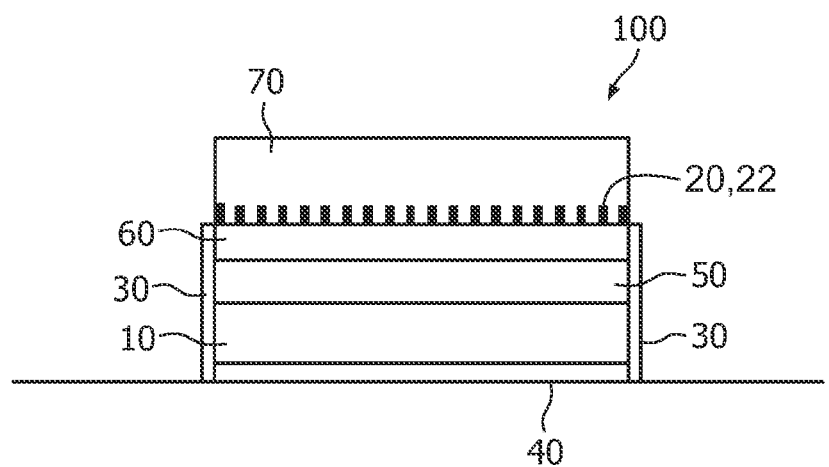
FIGS. 4-9 show different embodiments of a light emitting device according to the present invention.

FIG. 4 shows a light emitting device 100. The LED die 10 is adjacent the light reflective layer 40, and a transparent film 50 is arranged on top of the LED die 10. The LED die may be of any suitable material known per se, such as InGaN for ultraviolet and blue light, AlGaAs for red light, AlGaP or GaN for green etc. In case of a LED die comprising GaN, the transparent film 50 may comprise sapphire or silicon carbide in order to provide a proper deposition of the GaN during manufacturing. A light recycling layer 60 is arranged on top of the film 50, and the light polarizing layer 20 is arranged on a glass plate 70 mounted on top of the light recycling layer 60. The light blocking layer 30 is arranged on the side facets of the light emitting device 100. The light emitting device 100 as illustrated in FIG. 4 operates as follows.

The LED die 10 emit light at a specific wavelength, e.g. 400 nm, in all directions. The amount light having a direction downwards is reflected by the reflective layer 40, and the amount of light hitting the light blocking layer 30 is also reflected so that no light is transmitted through the blocking layer 30 or the reflective layer 40. The light blocking layer 30 and the light reflecting layer 40 may be arranged as a single layer, e.g. as a thin film of reflective metal. The amount of light having a direction upwards, i.e. directly emitted light or reflected light, is transmitted through the transparent film 50 and propagates through the light recycling layer 60. The light recycling layer 60 is designed to change the polarization state of the light, either by rotating the polarization state by a fixed angle or by providing a random distribution of polarization angles. Thus, the light recycling layer 60 may either be a retarding layer, i.e. a quarter wave film, or a scattering layer. When the light is incident on the glass plate 70 and the light polarizing layer 20, a first portion of light will be transmitted and a second portion of light will be reflected back towards the LED die 10. The transmitted light will have a polarization angle perpendicular to the metal stripes 22 of the light polarizing layer 20, and the reflected light will have a polarization angle parallel with the metal stripes 22 of the reflected light. The reflected light will interact with the light blocking layer 30 and the light reflective layer 40 and after a number of internal reflections, the light will once again be transmitted through the light recycling layer 60. This time, the polarization angle of the light will be changed, so that a new portion of the light will be transmitted through the light polarizing layer 20. This procedure is repeated and for each time the accumulated amount of transmitted polarized light is increased. The light blocking layer 30 prevent light having an undesired polarization angle to be transmitted from the side facets of the LED die 10. Thus, the contrast between the amount of light of a first polarization state and the amount of light of a second polarization state is increased.

The light recycling layer 60 may consist of a material with controlled macroscopic birefringence or, alternatively, a localized birefringence that is not controlled on a macroscopic scale. Typical layers with macroscopic birefringence, such as retarding quarter wave films (QWF) typically consist of stretched polymer films, such as stretched polycarbonate, but they can also be made from liquid crystal polymers (LCP's). The retarder can either be uniaxial or twisted. The retarder may also exist of multiple layers with different directions of the optical axis. For example, a combination of a QWF retarder and a half wave retarder can act together as a broadband quarter wave retarder.

Alternative materials with enhanced stability are feasible. More stable polymers are fluoro-polymers. A polymer of tetrafluoroethylene and hexafluoropropylene (FEP) polymer may be used. Other similar materials include a polymer of tetra-fluoroethylene and perfluorovinylether (PFA), or a polymer of tetrafluoroethylene and ethylene (ETFE) or a polymer of tetrafluoroethylene, hexafluoropropylene and vinylidene fluoride (THV). All these materials are known for their excellent thermal stability, chemical stability and light stability. Also polytetrafluoroethylene (teflon) might be used.

Other materials, such as sapphire, are known to be birefringent. Also, form-birefringent materials can be used as retarders, which show birefringence due to the nano-sized shape. Dielectric gratings with sub-wavelength periodicity can show birefringence and they can be used as, for instance, quarter wave retarders. Also nano-wires can be used as anisotropic photonic materials and used for their induced birefringence.

For maximum reflectance of the light directed back towards the LED die 10, the second surface 14 of the LED die 10 should have a high reflectance. Usually, the reflective layer 40 contains openings that act as contacting areas for the LED electrodes, such as p-doped GaN. Here, light might be lost. Thus, the aperture losses should be minimize by reducing the number of contact holes or by making these holes in the reflecting layer 40 as small as possible. Also the reflectance of the reflecting layer should be maximized. In one embodiment, the reflective layer 40 is a scattering layer.

Figure 5:
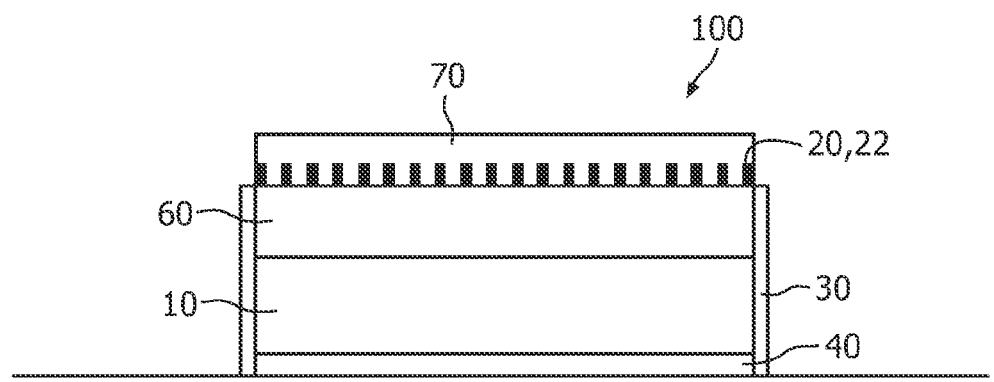

In the following, a number of embodiments of a light emitting device 100 will be described. In FIG. 5, the transparent plate 50 as shown in FIG. 4 is removed. Instead, the light polarizing layer 20 is arranged adjacent to the light recycling layer 60.

Figure 6:
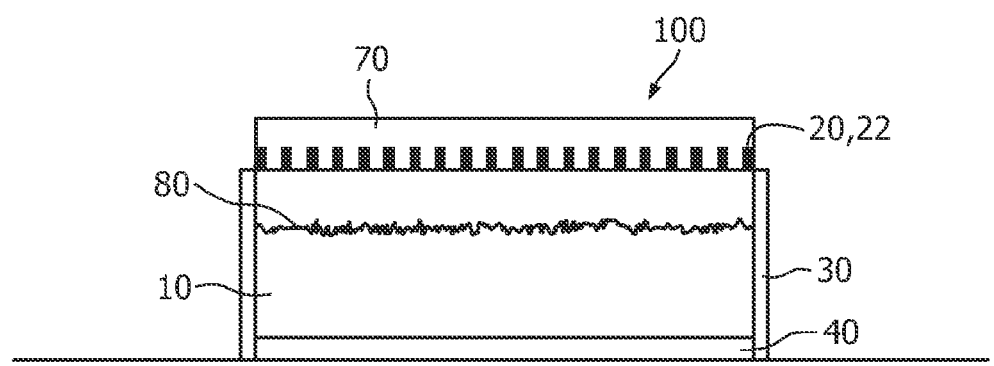

In FIG. 6, the light recycling layer 60 is designed as a rough surface of the LED die 10. A planarization layer 80 is arranged on top of the LED die 10, and a glass plate 70 carrying the light polarizing layer 20 is arranged on top of the planarization layer 80.

Figure 7:
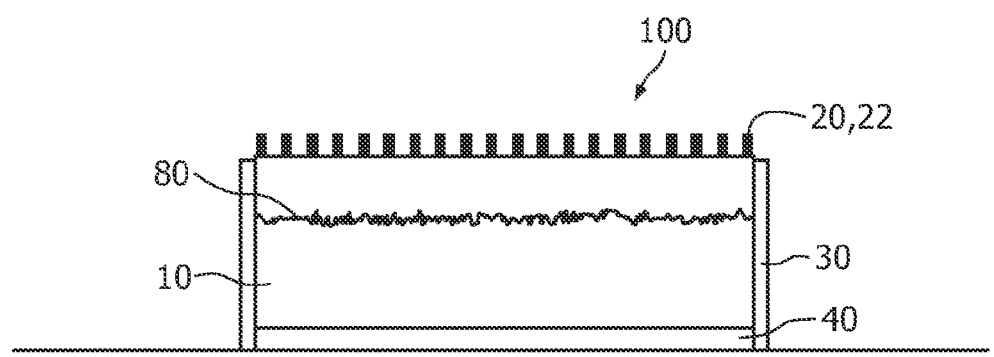

In FIG. 7, the light polarizing layer 20 is arranged directly on the planarization layer 80.

Figure 8:
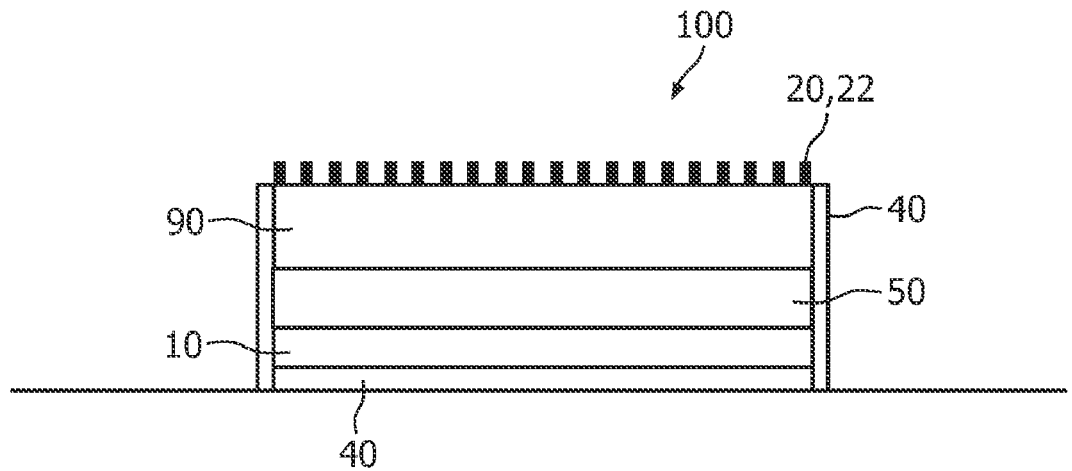
Figure 9:
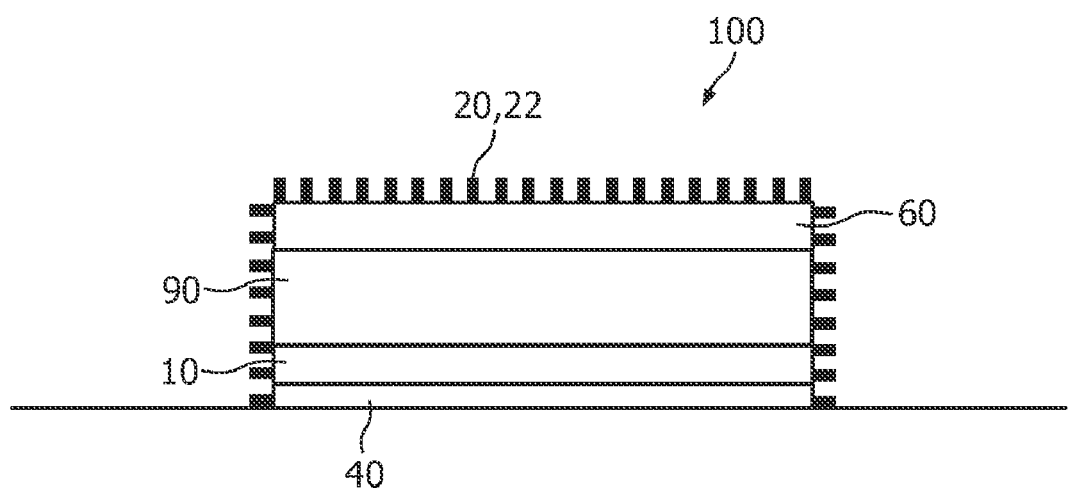

In further embodiments, the polarizing layer 20 is applied on phosphor converted LEDs that obtain a white or colored emission by phosphor conversion of blue or ultraviolet light emitted from a LED. As shown in FIGS. 8 and 9, the light polarizing layer 20 is arranged on top of the phosphor layer 90, since the polarization state will not be retained in the phosphorescence process. In FIG. 9, a light recycling layer 60 is arranged between the phosphor layer 90 and the light polarizing layer 20. With respect to FIGS. 8 and 9, the light emitting device 100 may have a transparent layer such as a sapphire layer 50 or it may not have such sapphire layer 50. The phosphor layer 90 may be bonded to the sapphire layer 50 or directly on the LED die 10. The light polarizing layer 20 may be present on the phosphor layer 90 and also on the side facets of the LED die 10. The light polarizing layer 20 may be processed directly on the surface or be supported by a substrate and glued to the phosphor layer 90. Furthermore, the light blocking layer 30 may contain a reflector, such as a metal in order to force the light to be emitted through the light polarizing layer 20 for enhanced performance. The phosphor layer 90 may also be shaped, for instance in a wedge form. The light recycling layer 60 can be arranged below the light polarizing layer 20 or below the phosphor layer 90. Additional scattering layers (not shown) may be incorporated to depolarize the reflected light, for instance, on top of the phosphor layer 90 or below the phosphor layer 90. The phosphor layer 90 may be transparent but it may also contain scattering centers for enhanced depolarization.

The light polarizing layer 20 may be produced directly on the LED die 10 or on the phosphor layer 90, preferably on a wafer scale and thereafter diced subsequently. Alternatively, the light polarizing layer 20 may be produced conventionally on a carrier substrate, such as thin glass (e.g. 0.2 mm), diced and subsequently coupled to the LED die 20 or phosphor layer 90 either with a suitable adhesive or without optical contact.

A spherical dome of any type known per se may be arranged on the light emitting device 100 of any disclosed embodiment. This enhances the light extraction from the light emitting device 100, it minimizes reflections losses and extracts light that would otherwise be waveguided in the flat optical stack.

The angle between the first surface 12 and the side facets 16 of the LED die 10 can be 90°. In other embodiments, the angle between the first surface 12 and the side facets 16 of the LED die 10 can be smaller, e.g. 45°. One of the layers, e.g. the phosphor layer 90 or the light recycling layer 60 could be shaped to contain side faces at a lower angle, e.g. 45°, thus resulting in a pyramid shape of the light emitting device. Such side facets can extend outside the light emitting device or just fit with the LED die 10 or with the light blocking layer 30. The light polarizing layer 20, e.g. a wire-grid polarizer, can be arranged on top of the side facets e.g. by lithographic processes. Also, the polarizing layer 20 can be curved or the phosphor layer 90 can be curved. The dome itself can also form a curved surface, on which the polarizing layer 20 can be deposited onto.

The invention has mainly been described above with reference to a few embodiments. However, as is readily appreciated by a person skilled in the art, other embodiments than the ones disclosed above are equally possible within the scope of the invention, as defined by the appended patent claims.

The invention claimed is:

1. A light emitting device, comprising:
   a light emitting diode (LED) die having a first surface, a second surface and at least one side facet connecting the first surface and the second surface;
   a first portion of a light polarizing layer;
   a second portion of the light polarizing layer; and
   a light reflecting layer,
wherein the first portion of the light polarizing layer is arranged on the first surface, the second portion of the light polarizing layer is arranged on the at least one side facet, the light reflecting layer is arranged on the second surface of the LED die, and the light polarizing layer includes grating stripes that are each arranged in both the first portion of the light polarizing layer and the second portion of the light polarizing layer.

2. A light emitting device according to claim 1, wherein the first portion of the light polarizing layer is completely covering the first surface.

3. A light emitting device according to claim 1, wherein the second portion of the light polarizing layer is completely covering the at least one side facet.

4. A light emitting device according to claim 1, wherein the light reflecting layer is completely covering the second surface.

5. A light emitting device according to claim 1, wherein the light polarizing layer is a reflective polarizing layer.

6. A light emitting device according to claim 1, wherein the light polarizing layer is a wire-grid grating.

7. A light emitting device according to claim 1, further comprising a wavelength conversion layer arranged between the light polarizing layer and the LED die.

8. A light emitting device according to claim 7, wherein the wavelength conversion layer is a phosphor layer.

9. A light source, comprising at least one light emitting device according to claim 1.

10. A method for providing polarized light from a light emitting diode (LED) die having a first surface, a second surface and at least one side facet connecting the first surface and the second surface, wherein the method comprises the steps of:

emitting a first amount of light from the first surface of the LED die, emitting a second amount of light from the at least one side facet of the LED die, blocking a first portion of the second amount of light by means of a first portion of a light polarizing layer arranged on the at least one side facet, blocking a first portion of the first amount of light by means of a second portion of the light polarizing layer arranged on the first surface, wherein the light polarizing layer includes grating stripes that are each arranged in both the first portion of the light polarizing layer and the second portion of the light polarizing layer, transmitting a second portion of the first amount of light through the first portion of the light polarizing layer, converting a polarization state of the first portion of the first amount of light, and transmitting the converted first portion of the first amount of light by means of the first portion of the light polarizing layer.

* * * * *